(12) United States Patent
Wu et al.

(10) Patent No.: US 11,515,299 B2
(45) Date of Patent: Nov. 29, 2022

(54) METHOD FOR MANUFACTURING DISPLAY ARRAY

(71) Applicant: Industrial Technology Research Institute, Hsinchu (TW)

(72) Inventors: Ming-Hsien Wu, Hsinchu County (TW); Chia-Hsin Chao, Hsinchu County (TW); Yen-Hsiang Fang, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/232,064

(22) Filed: Dec. 26, 2018

(65) Prior Publication Data

US 2019/0355705 A1 Nov. 21, 2019

Related U.S. Application Data

(60) Provisional application No. 62/672,061, filed on May 16, 2018.

(30) Foreign Application Priority Data

Dec. 11, 2018 (TW) ................................. 107144426

(51) Int. Cl.
*H01L 25/18* (2006.01)
*H01L 27/12* (2006.01)
*H01L 27/15* (2006.01)

(52) U.S. Cl.
CPC .......... *H01L 25/18* (2013.01); *H01L 27/1259* (2013.01); *H01L 27/156* (2013.01)

(58) Field of Classification Search
None
See application file for complete search history.

(56) References Cited

U.S. PATENT DOCUMENTS

| 5,216,263 A | 6/1993 | Paoli |
| 5,453,386 A | 9/1995 | Holm et al. |

(Continued)

FOREIGN PATENT DOCUMENTS

| CN | 1666580 | 9/2005 |
| CN | 101268554 | 9/2008 |

(Continued)

OTHER PUBLICATIONS

"Office Action of Taiwan Counterpart Application," dated Sep. 27, 2019, p. 1-p. 3.

(Continued)

*Primary Examiner* — Michelle Mandala
(74) *Attorney, Agent, or Firm* — JCIPRNET

(57) ABSTRACT

A method for manufacturing a display array includes the following steps: providing a substrate and forming a semiconductor stacked layer on the substrate; forming an insulating layer and a plurality of electrode pads on an outer surface of the semiconductor stacked layer, the insulating layer and the electrode pads directly contacting the semiconductor stacked layer, wherein the insulating layer has a plurality of openings, and the electrode pads are respectively located in the openings of the insulating layer and separated by the insulating layer; and transferring the semiconductor stacked layer, the insulating layer and the electrode pads from the substrate to a driving backplane, wherein the electrode pads are respectively electrically connected to a portion of the semiconductor stacked layer and the driving backplane through the openings of the insulating layer to form a plurality of light emitting regions in the semiconductor stacked layer.

9 Claims, 12 Drawing Sheets

(56) References Cited

U.S. PATENT DOCUMENTS

| | | | |
|---|---|---|---|
| 5,789,766 | A | 8/1998 | Huang et al. |
| 7,323,723 | B2 | 1/2008 | Ohtsuka et al. |
| 7,344,903 | B2 | 3/2008 | Erchak et al. |
| 8,304,265 | B2 | 11/2012 | Nakamura et al. |
| 8,736,527 | B2 | 5/2014 | Verlinden |
| 9,012,930 | B2 | 4/2015 | Akagi |
| 9,029,888 | B2 * | 5/2015 | Kim ............... H01L 33/382 |
| | | | 257/98 |
| 9,231,153 | B2 | 1/2016 | Chen et al. |
| 9,443,885 | B2 | 9/2016 | Nakata et al. |
| 9,711,489 | B2 | 7/2017 | Pang et al. |
| 10,249,797 | B2 * | 4/2019 | Kim ............... H01L 33/32 |
| 2004/0235210 | A1 | 11/2004 | Tamura et al. |
| 2005/0127390 | A1 | 6/2005 | Lin et al. |
| 2008/0030570 | A1 | 2/2008 | Nomura et al. |
| 2008/0237611 | A1 * | 10/2008 | Cok ............... H01L 51/5284 |
| | | | 257/79 |
| 2011/0037083 | A1 | 2/2011 | Chan et al. |
| 2011/0198628 | A1 | 8/2011 | Kim |
| 2011/0316036 | A1 | 12/2011 | Furukawa |
| 2015/0115290 | A1 | 4/2015 | Guenard |
| 2015/0129922 | A1 | 5/2015 | Akagi |
| 2015/0243847 | A1 * | 8/2015 | Kim ............... H01L 33/38 |
| | | | 257/99 |
| 2017/0186908 | A1 | 6/2017 | Robin et al. |
| 2018/0108822 | A1 | 4/2018 | Matsuda et al. |

FOREIGN PATENT DOCUMENTS

| | | |
|---|---|---|
| CN | 101728378 | 6/2010 |
| CN | 102201507 | 9/2011 |
| CN | 102217102 | 10/2011 |
| CN | 102255022 | 11/2011 |
| CN | 103700682 | 4/2014 |
| CN | 104396030 | 3/2015 |
| CN | 104584110 | 4/2015 |
| CN | 105870265 | 8/2016 |
| CN | 106876406 | 6/2017 |
| CN | 107017319 | 8/2017 |
| CN | 107507906 | 12/2017 |
| CN | 107887403 | 4/2018 |
| CN | 107910414 | 4/2018 |
| CN | 107946415 | 4/2018 |
| EP | 3185294 | 6/2017 |
| TW | 200834989 | 8/2008 |
| TW | 200933938 | 8/2009 |
| TW | 201543717 | 11/2015 |
| TW | I566395 | 1/2017 |
| TW | 201721833 | 6/2017 |
| TW | 201806191 | 2/2018 |
| WO | 2009037874 | 3/2009 |
| WO | 2009081325 | 7/2009 |

OTHER PUBLICATIONS

"Office Action of Taiwan Counterpart Application," dated Aug. 19, 2019, p. 1-p. 6.

Christian Gosler et al., "GaN-based micro-LED arrays on flexible substrates for optical cochlear implants," Journal of Physics D: Applied Physics, vol. 47, No. 205401, Apr. 2014, pp. 1-6.

Jacob Day et al., "III-Nitride full-scale high-resolution microdisplays," Applied Physics Letters, vol. 99, No. 031116, Jul. 2011, pp. 1-3.

Francois Templier et al., "GaN-based Emissive Microdisplays: A Very Promising Technology for Compact, Ultra-high Brightness Display Systems," Journal of the SID, vol. 24, Issue 11, Jan. 2017, pp. 669-675.

Francois Olivier et al., "Influence of size-reduction on the performances of GaN-based micro-LEDs for display application," Journal of Luminescence, vol. 191, Nov. 2017, pp. 112-116.

Johannes Herrnsdorf et al., "Active-Matrix GaN Micro Light-Emitting Diode Display With Unprecedented Brightness," IEEE Transactions on Electron Devices, vol. 62, Issue 6, Jun. 2015, pp. 1918-1925.

"Office Action of Taiwan Counterpart Application," dated Nov. 21, 2019, p. 1-p. 4.

Office Action of China Counterpart Application, dated Apr. 19, 2021, pp. 1-11.

"Office Action of China Related Application No. 201811600357.8", dated Apr. 20, 2021, pp. 1-12.

"Office Action of China Counterpart Application", dated Nov. 12, 2021, p. 1-p. 18.

"Office Action of China Counterpart Application", dated Aug. 12, 2021, p. 1-p. 12.

* cited by examiner

METHOD FOR MANUFACTURING DISPLAY ARRAY

CROSS-REFERENCE TO RELATED APPLICATION

This application claims the priority benefits of U.S. provisional application Ser. No. 62/672,061, filed on May 16, 2018 and Taiwan application serial no. 107144426, filed on Dec. 11, 2018. The entirety of each of the above-mentioned patent applications is hereby incorporated by reference herein and made a part of this specification.

TECHNICAL FIELD

The disclosure relates to a method for manufacturing a semiconductor structure, and particularly relates to a method for manufacturing a display array.

BACKGROUND

Micro light emitting diodes (micro LEDs) exhibit the properties of long life span, miniature size, high shock resistance, low heat emissivity, and low power consumption, etc., and have been applied to tablets and small-sized displays. In recent years, micro LEDs are being developed for multicolor and high illumination. Therefore, in future technological applications, micro LEDs will have a wider range and more aspects of application, and may even replace the conventional LEDs.

However, in the conventional technologies, reducing the size of a die mainly faces two challenges. First, regarding the light emitting efficiency, since the micro LED has a size on the nanometer scale, compared with the normal-sized LED, the deterioration in light emitting efficiency resulting from the edge of a die may account for a considerable portion of the overall light emitting efficiency. Besides, in the manufacture of an array of the micro LEDs, in addition to cutting or patterning the dies in advance to define different light emitting platforms, the processes such as providing a common electrode, planarization, and mass transfer, etc., are also required. Therefore, the manufacture is complicated, and the cost is also high.

SUMMARY

The disclosure provides a method for manufacturing a display array capable of facilitating the light emitting efficiency and alleviating the manufacturing difficulty.

The disclosure provides a method for manufacturing a display array. The method includes the following. A substrate is provided, and a semiconductor stacked layer is formed on the substrate. An insulating layer and a plurality of electrode pads are formed on an outer surface of the semiconductor stacked layer. The insulating layer and the electrode pads directly contact the semiconductor stacked layer. In addition, the insulating layer has a plurality of openings, and the electrode pads are respectively located in the openings of the insulating layer and separated by the insulating layer. The semiconductor stacked layer, the insulating layer and the electrode pads are transferred from the substrate to a driving backplane. The electrode pads are respectively electrically connected to a portion of the semiconductor stacked layer and the driving backplane through the openings of the insulating layer to form a plurality of light emitting regions in the semiconductor stacked layer, and the adjacent light emitting regions in the semiconductor stacked layer are not patterned.

Based on the above, in the method for manufacturing the display array according to the embodiments of the disclosure, the semiconductor stacked layer, the insulating layer, and the electrode pads are formed on the substrate, and the insulating layer has the openings, so that the electrode pads are located in the openings of the insulating layer and are separated by the insulating layer. In this way, the electrode pads are respectively electrically connected to a portion of the semiconductor stacked layer through the openings of the insulating layer, so as to form the light emitting regions electrically isolated from each other in the semiconductor stacked layer. Therefore, compared with the conventional process, the manufacturing process can be simplified, and the manufacturing difficulty can be alleviated. In addition, the issue in the conventional process that an edge is created in the die after an etching process, which results in edge light emitting efficiency deterioration, is avoided.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Through the development of science and technology, the sizes of displays are also being scaled down gradually, so the size of internal components and structures of the displays also require reduction. Therefore, the display array provided in an embodiment of the disclosure may serve as a display array in a micro LED display, and renders a desirable light emitting effect. In other words, the display is a micro display array formed by micro LEDs.

Figure 1A:
FIG. 1A to FIG. 1G are schematic cross-sectional views illustrating a method for manufacturing a display array according to an embodiment of the disclosure.
Figure 1B:
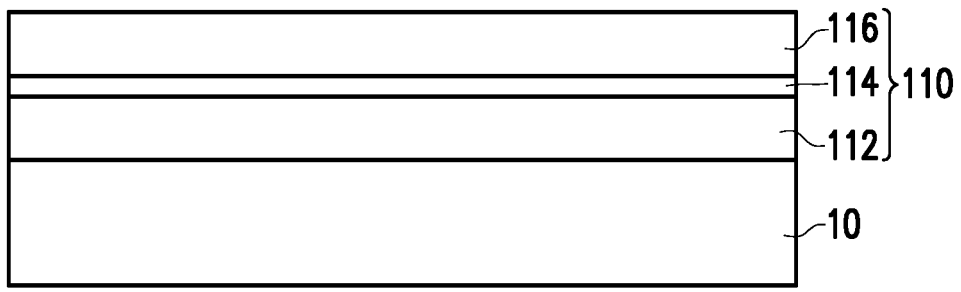

FIG. 1A to FIG. 1G are schematic cross-sectional views illustrating a method for manufacturing a display array according to an embodiment of the disclosure. Referring to FIG. 1A and FIG. 1B, in a chip package process of this embodiment, firstly, a substrate 10 is provided, and a semiconductor stacked layer 110 is formed on the substrate 10. In this embodiment, the substrate 10 may be a GaAs substrate, a GaP substrate, an InP substrate, a sapphire substrate, an SiC substrate, a Si substrate, or a GaN substrate, so as to be adapted to deposite a plurality of semiconductor material layers, a plurality of conductive material layers, and/or a plurality of insulating material layers on the surface of the substrate 10.

In this embodiment, the semiconductor stacked layer 110 includes a first semiconductor material layer 112, a light emitting material layer 114, and a second semiconductor material layer 116. The first semiconductor material layer 112 is a P-type semiconductor layer, and the second semiconductor material layer 116 is an N-type semiconductor layer. However, the disclosure is not limited thereto. In other embodiments, the first semiconductor material layer 112 may be an N-type semiconductor layer, and the second semiconductor material layer 116 may be a P-type semiconductor layer. The material of the N-type semiconductor layer includes, for example, n-GaN doped by a group IVA element, and the material of the P-type semiconductor layer includes, for example, p-GaN doped by a group IIA element. The light emitting material layer 114 includes a multiple quantum well (MQW) structure, for example. The MQW structure includes a plurality of quantum well layers and a plurality of quantum barrier layers that are alternately disposed repeatedly.

More specifically, the material of the light emitting material layer 114 includes a plurality of InGaN layers and a plurality of GaN layers that are stacked alternately. By designing the proportion of In or Ga in the light emitting material layer 114, the light emitting material layer 114 is capable of emitting light in a predetermined color. In this embodiment, the emitted light is blue light or ultraviolet light, for example. The first semiconductor material layer 112, the light emitting material layer 114, and the second semiconductor material layer 116 may be formed by performing a metal-organic chemical vapor deposition (MOCVD) process, for example. The materials or the formation processes of the first semiconductor material layer 112, the light emitting material layer 114, or the second semiconductor material layer 116 described above merely serve as examples, and the disclosure is not limited thereto.

It should be noted that the semiconductor stacked layer 110 is not patterned or dice. In other words, the semiconductor stacked layer 110 is not subjected to a photolithography process or an etching process, or the semiconductor stacked layer 110 is not subjected to a dicing process to be further divided into regions. Therefore, the semiconductor stacked layer 110 is a continuously extending structure in an extending direction parallel to the substrate 10. As a result, the manufacturing difficulty of the display array can be alleviated.

Figure 1C:
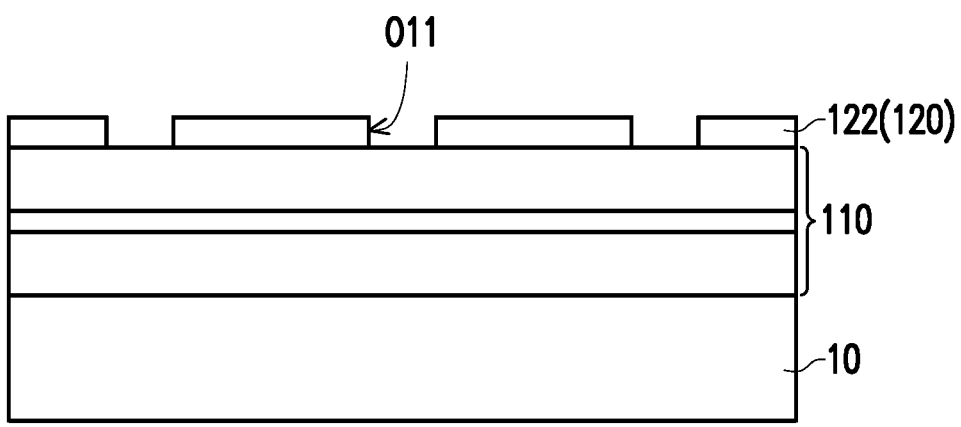
Figure 1D:
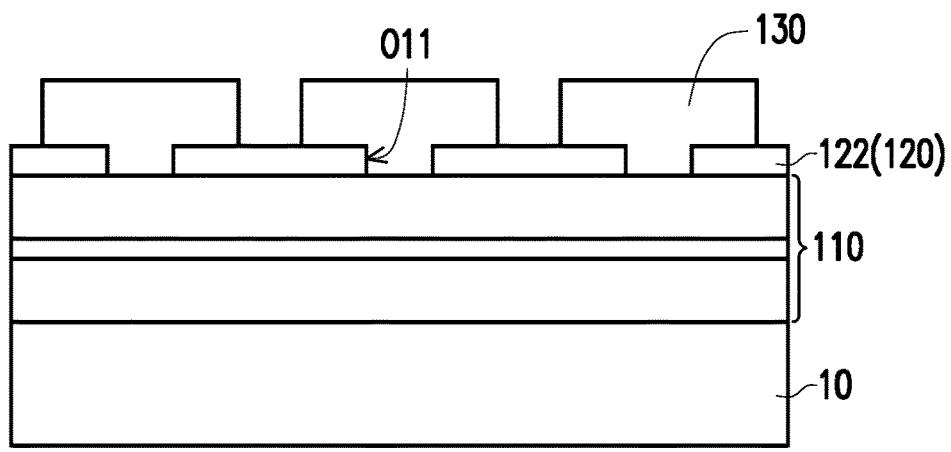
Figure 1E:
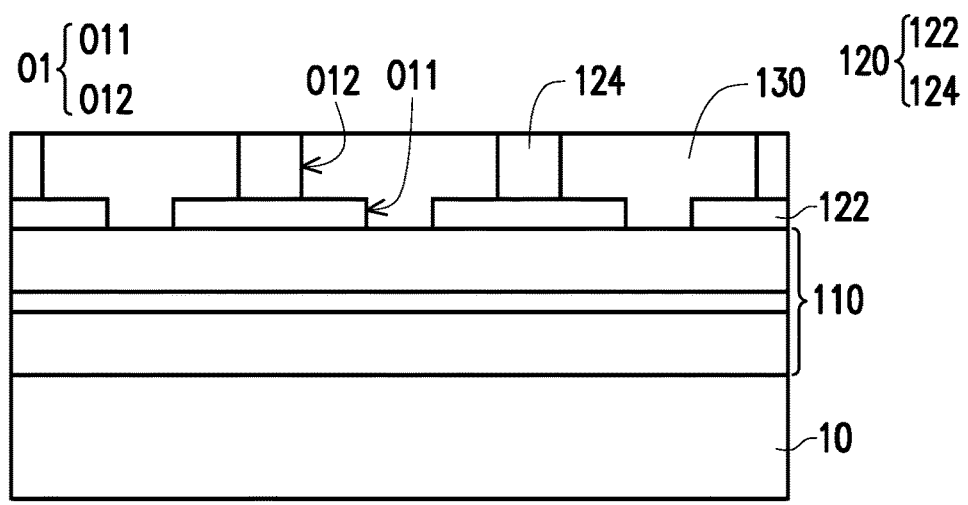

Referring to FIG. 1C to FIG. 1E, After the processes above, an insulating layer 120 and a plurality of electrode pads 130 are formed on the semiconductor stacked layer 110. The insulating layer 120 has a plurality of openings O1, and the electrode pads 130 are respectively located in the openings O1 of the insulating layer 120 and are separated by the insulating layer 120. In addition, the insulating layer 120 is directly connected to the outer surface of the semiconductor stacked layer 110, as shown in FIG. 1E. Specifically, in this embodiment, the insulating layer 120 includes a first insulating layer 122 and a second insulating layer 124. The first insulating layer 122, for example, is a dielectric protection layer formed by an insulating material and patterned into an array arrangement on the semiconductor stacked layer 110. In addition, the first insulating layer 122 has a plurality of openings O11. A light absorptive insulating material or a reflective insulating material may be adopted as the insulating material. The light absorptive insulating material may be directly manufactured from a material having a light absorptive property, and the reflective insulating material may be manufactured from a plurality of coating films having different refractive indices, which render a reflecting effect. However, the disclosure is not limited thereto. The electrode pads 130 are disposed in the openings O11 of the first insulating layer 122. The second insulating layer 124 may be a packaging insulating gel or an under-fill layer with insulating property or a dielectric film filled to the space between the electrode pads 130 and fixing the electrode pads 130 and the first insulating layer 122. Each of the electrode pads 130 may be arranged to be located in the opening O1 jointly formed by the opening O11 of the first insulating layer 122 and an opening O12 of the second insulating layer 124. In addition, the first insulating layer 122 is located between the second insulating layer 124 and the semiconductor stacked layer 110. In other words, in the openings O1 of the insulating layer 120, the electrode pads 130 directly contact the insulating layer. Therefore, the electrode pads 130 are respectively electrically connected to a portion of the semiconductor stacked layer 110 through the openings O1, so as to form a plurality of light emitting regions (as exemplified by light emitting regions A in FIG. 1G) in the semiconductor stacked layer 110. Specifically, in the manufacturing process, the area in which each electrode pad 130 contacts the semiconductor stacked layer 110 and the pitch between the adjacent electrode pads 130 may be designed, so as to electrically isolate adjacent light emitting regions from each other. In addition, the arrangement pitch of the electrode pads 130 is the same as the arrangement pitch of sub-pixels of a display panel. More specifically, the light emitting regions being electrically isolated from each other refers to a plurality of light emitting regions being partially electrically insulated, or a plurality of light emitting regions being completely electrically insulated. The disclosure does not intend to impose a limitation in this regard.

Figure 1F:
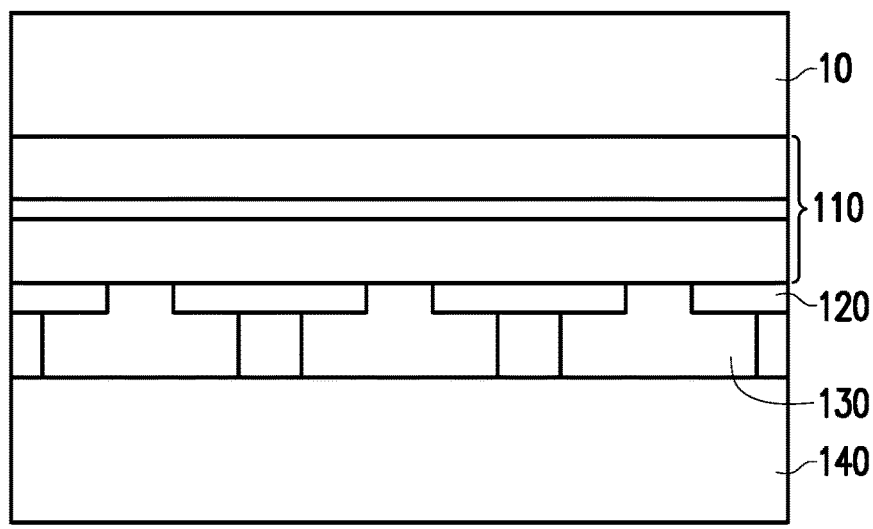
Figure 1G:
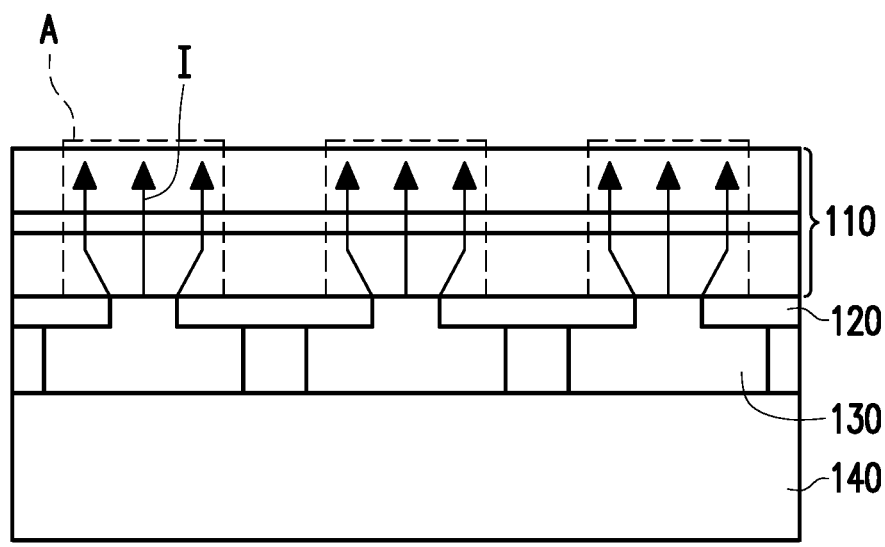
Figure 2:
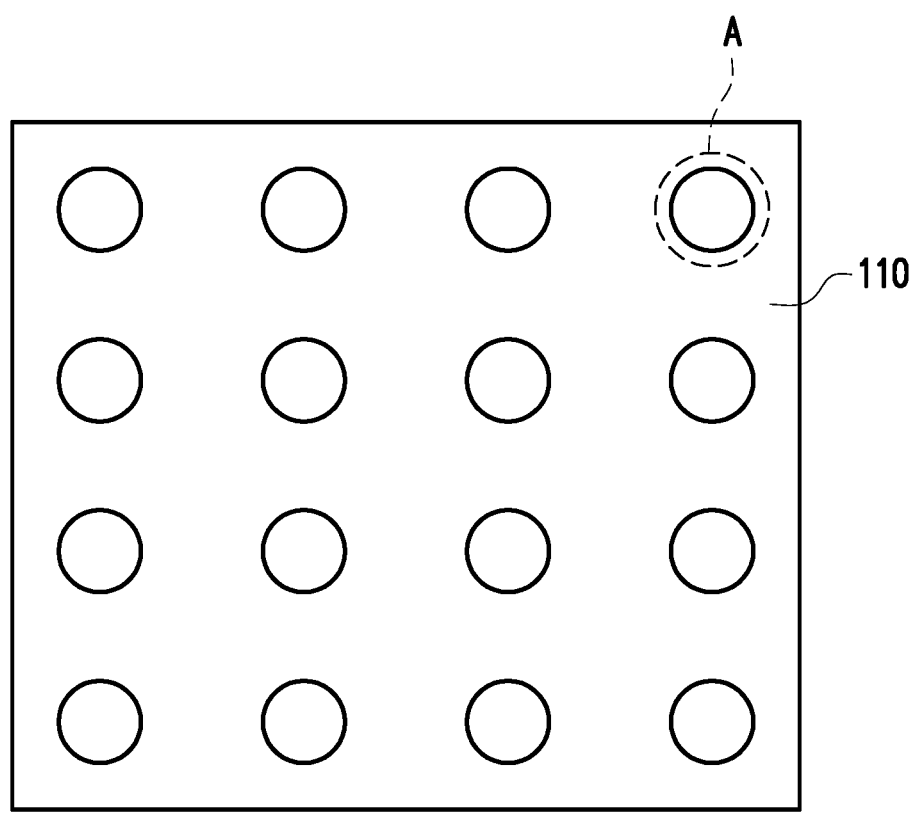
FIG. 2 is a schematic top view of the display array of FIG. 1G.

FIG. 2 is a schematic top view of the display array of FIG. 1G. Referring to FIG. 1F, FIG. 1G, and FIG. 2, after the above processes, the semiconductor stacked layer 110, the insulating layer 120, and the electrode pads 130 are transferred from the substrate 10 to a driving backplane 140 to form a display array 100. The material of the driving backplane 140 may include glass, quartz, an organic polymer, a Si wafer, or other suitable materials, and is suitable for electrical connection with the semiconductor stacked layer 110 or the electrode pads 130. However, the disclosure is not limited thereto. In this embodiment, a bonding process is firstly performed to bond a side of the semiconductor stacked layer 110 facing away from the substrate 10 and the driving backplane 140. After the boding process, the substrate 10 is removed. Specifically, after the structure is flipped upside down (as shown in FIG. 1F), the substrate 10 is separated from the semiconductor stacked layer 110 by performing a laser lift-off (LLO) process or other suitable processes.

Besides, in some embodiments, the transfer of the semiconductor stacked layer 110, the insulating layer 120, and the electrode pads 130 from the substrate 10 to the driving backplane 140 may also be carried out by firstly removing the substrate 10 prior to bonding process ("removing-then-bonding process"), or by firstly transferring the semiconductor stacked layer 110, the insulating layer 120, and the electrode pads 130 from the substrate 10 to a temporary substrate and then performing the removing and bonding processes ("transferring-then-removing and bonding process"), so that the electrode pads 130 are located between the semiconductor stacked layer 110 and the driving backplane 140. However, the disclosure is not limited thereto. In other similar embodiments, the semiconductor stacked layer 110, the insulating layer 120, and the electrode pads 130 may be disposed to an adhesive layer, such as an adhesive paste, after the substrate 10 is removed, and then the adhesive layer is attached to the driving backplane 140, so as to complete the display array in which the adhesive layer is located between the electrode pads 130 and the driving backplane 140. However, the disclosure is not limited thereto, either.

Therefore, after the above processes are completed, the light emitting regions A electrically insulated from each other are formed, and the electrode pads 130 can be driven by the driving backplane 140 to drive the light emitting regions A. In addition, by respectively disposing the electrode pads 130 in the openings (such as the openings O1 in FIG. 1E) of the insulating layer 120, the light emitting regions A are driven independently. Therefore, a voltage may be applied between the light emitting surface and the end at which the electrode pads 130 are disposed, so that the light emitting regions A are supplied with a current I to emit light individually without interfering light emission of the adjacent light emitting regions A, as shown in FIG. 2. In this embodiment, the arrangement pitch of two adjacent light emitting regions A is less than or equal to 20 micrometers. In other words, an interval between two light emitting central points of two adjacent light emitting regions A is less than or equal to 20 micrometers. In another embodiment, the arrangement pitch of two adjacent light emitting regions A is less than or equal to 10 micrometers. Specifically, regarding optical behaviors, if the light emitted by one of the light emitting regions A is transmitted to the adjacent light emitting region A, the light is still refrained from being emitted from the adjacent light emitting region A because of a total reflection phenomenon resulting from an excessively small inclined angle with respect to the light emitting surface. A conductive layer may be additionally disposed at the side of the light emitting surface of the display array 100 of this embodiment. Details about such configuration will be described hereinafter. However, the disclosure is not limited thereto. In this way, compared with the conventional process, the manufacturing process can be simplified, and the manufacturing difficulty can be alleviated. In addition, the issue in the conventional process that an edge is created in the die after an etching process, which results in edge light emitting efficiency deterioration can also be solved.

Figure 3:
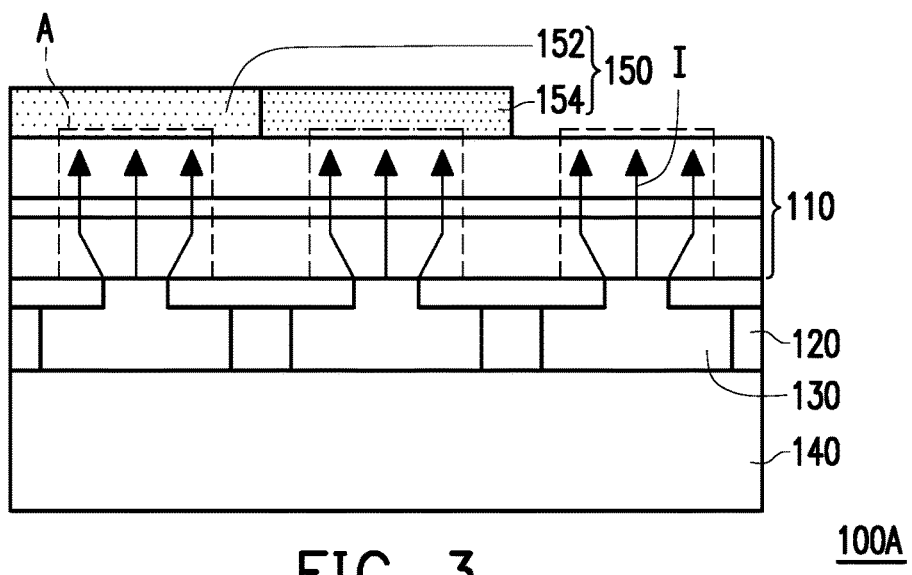
FIG. 3 is a schematic cross-sectional view illustrating a display array according to another embodiment of the disclosure.

FIG. 3 is a schematic cross-sectional view illustrating a display array according to another embodiment of the disclosure. Referring to FIG. 3, a display array 100A of this embodiment is similar to the display array 100 of FIG. 1G. However, the display arrays 100A and 100 differ in that the display array 100A of this embodiment further includes a plurality of color converters 150 disposed at the light emitting side of the semiconductor stacked layer 110. For example, in this embodiment, the semiconductor stacked layer 110 emits blue light Therefore, a red light converter 152 and a green light converter 154, such as quantum dot films, may be designed and disposed in the array formed of the light emitting regions. Therefore, the light emitted by the display array 100A has the colors of red, green, and blue, so as to be applied in displays of various kinds.

Figure 4:
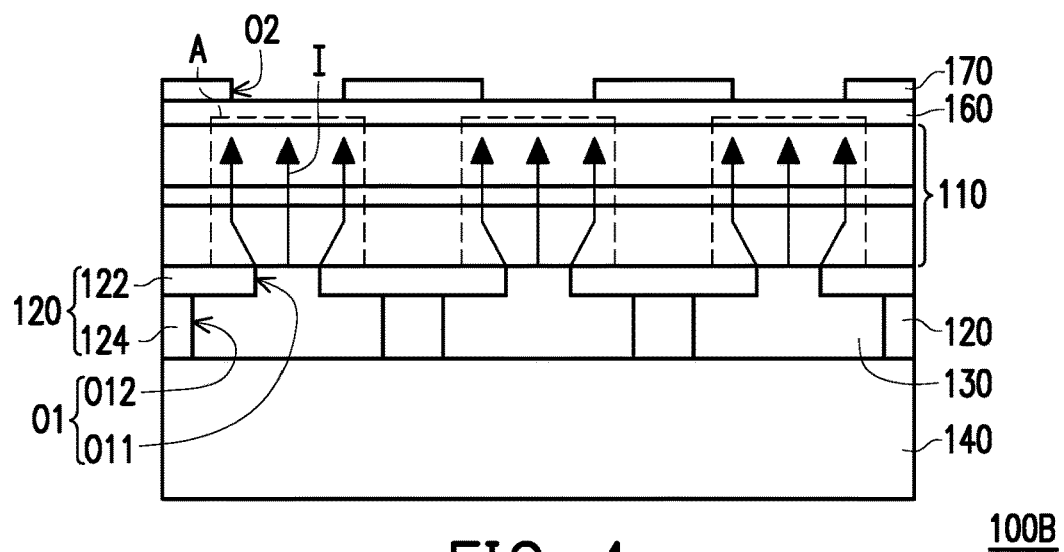
FIG. 4 is a schematic cross-sectional view illustrating a display array according to another embodiment of the disclosure.

FIG. 4 is a schematic cross-sectional view illustrating a display array according to another embodiment of the disclosure. Referring to FIG. 4, a display array 100B of this embodiment is similar to the display array 100 of FIG. 1G. However, the display arrays 100B and 100 differ in that the display array 100B of this embodiment further includes an electrode layer 160 and a light absorbing layer 170. The electrode layer 160 is disposed on the semiconductor stacked layer 110, and the light absorbing layer 170 is disposed on the electrode layer 160. In addition, the electrode layer 160 is located between the light absorbing layer 170 and the semiconductor stacked layer 110. Specifically, after the process step in FIG. 1G, the process steps of forming the electrode layer 160 on the semiconductor stacked layer 110 and forming the light absorbing layer 170 on the electrode layer 160 may be further performed.

Specifically, in this embodiment, the electrode layer 160 includes a transparent conductive material, such as an indium tin oxide (ITO) film. The light absorbing layer 170, for example, includes a black light absorbing material, and has a plurality of openings O2. The light emitting regions A are located between the openings O2 of the light absorbing layer 170 and the electrode pads 130. Therefore, with a voltage applied between the electrode pads 130 and the electrode layer 160, the light emitting regions A of the semiconductor stacked layer 110 may emit light, and the contrast can be increased as the emitted light is transmitted through the openings O2 of the light absorbing layer 170. From a top perspective view, the display area of the display array 100B may be defined as the area occupied by the openings O2 of the light absorbing layer 170, and the occupied area may be smaller than or equal to the light emitting area of the light emitting regions A, so as to increase the contrast. Specifically, the light emitting area of the light emitting regions A is greater than or equal to the area occupied by the openings O2 of the light absorbing layer 170. In addition, the area occupied by the openings O2 of the light absorbing layer 170 is greater than the area occupied by the openings O11 of the first insulating layer 122. In other words, the covering area of the light absorbing layer 170 is smaller than the covering area of the first insulating layer 122. Therefore, with the size of the opening O11 of the first insulating layer 122, the light emitting region A can be electrically isolated from the adjacent light emitting region A, and the light emitting area of the light emitted by the light emitting region A can be limited by the opening O2 of the light absorbing layer 170. Moreover, the arrangement pitch of the adjacent openings O11 of the first insulating layer 122 is the same as the arrangement pitch of the adjacent sub-pixels of the display panel. In this way, the light emitting quality of the display array 100B can become desirable by arranging the display area of the display array 100B.

Figure 5:
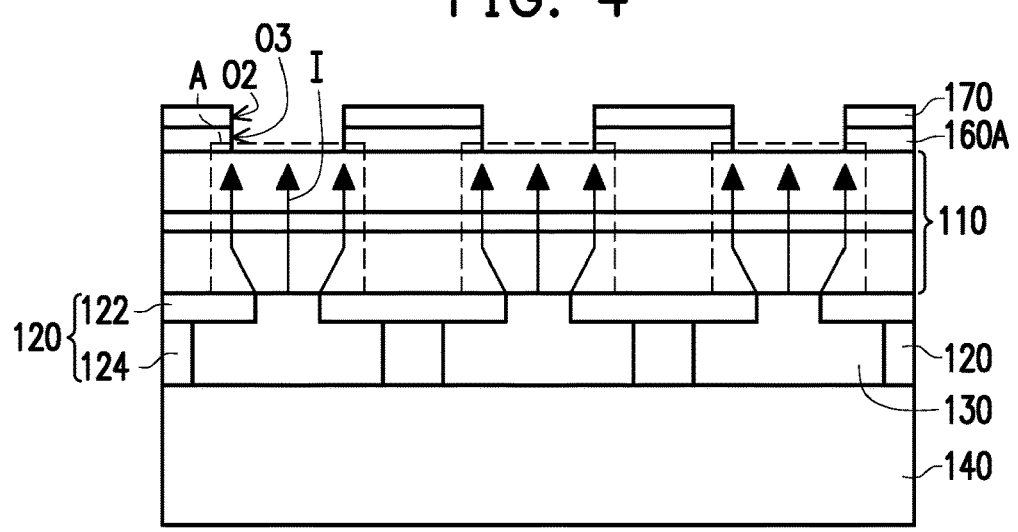
FIG. 5 is a schematic cross-sectional view illustrating a display array according to another embodiment of the disclosure.

FIG. 5 is a schematic cross-sectional view illustrating a display array according to another embodiment of the disclosure. Referring to FIG. 5, a display array 100C of this embodiment is similar to the display array 100B of FIG. 4. However, the display arrays 100B and 100C differ in that an electrode layer 160A of the display array 100C of this embodiment further includes a plurality of openings O3, and the openings O3 of the electrode layer 160A are located between the openings O2 of the light absorbing layer 170 and the light emitting regions A. In this embodiment, the electrode layer 160A is a metal mesh electrode, for example. Specifically, in this embodiment, the electrode layer 160A is formed by an opaque conductive material. Therefore, the light emitting area of the light emitted by the light emitting regions A of this embodiment may be limited by the openings O3 of the electrode layer 160A and the openings O2 of the light absorbing layer 170. In this embodiment, the size of the opening O3 of the electrode layer 160A may be the same as or different from the size of the opening O2 of the light absorbing layer 170. The disclosure does not intend to impose a limitation in this regard. In addition, it should be noted that the material of the first insulating layer 122 in the display array 100B shown in FIG. 4 and the display array 100C shown in FIG. 5 may be the same as the material of the light absorbing layer 170 of FIG. 4, so as to absorb the light at a side of the semiconductor stacked layer 110 facing away from the light emitting surface.

Figure 6:
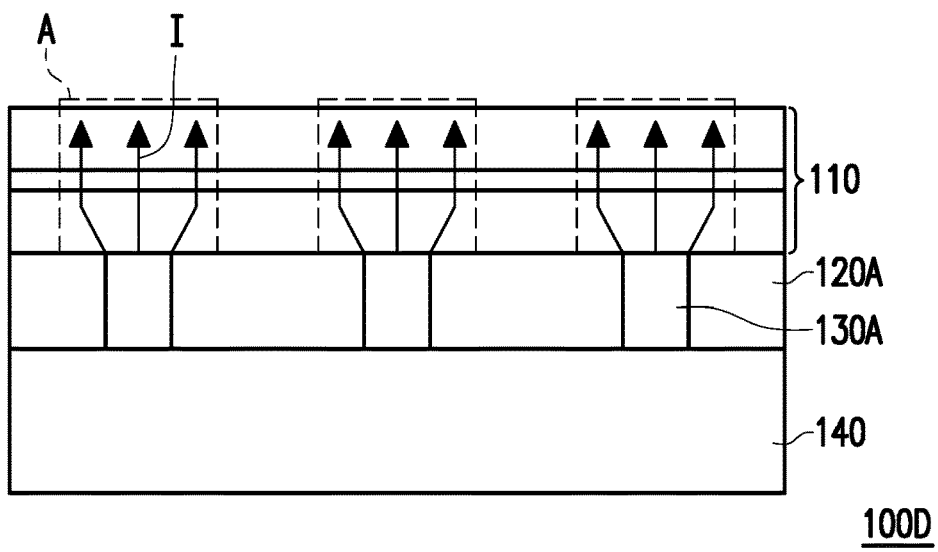
FIG. 6 is a schematic cross-sectional view illustrating a display array according to another embodiment of the disclosure.
Figure 7A:
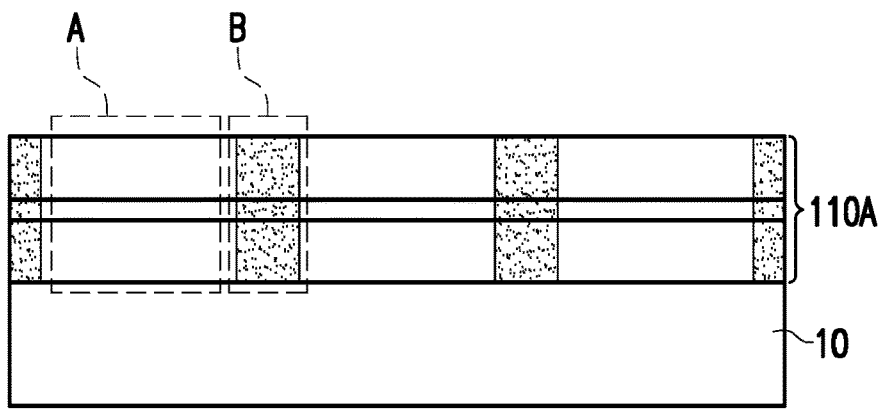
FIG. 7A to FIG. 7F are schematic cross-sectional views illustrating a method for manufacturing a display array according to another embodiment of the disclosure.
Figure 7B:
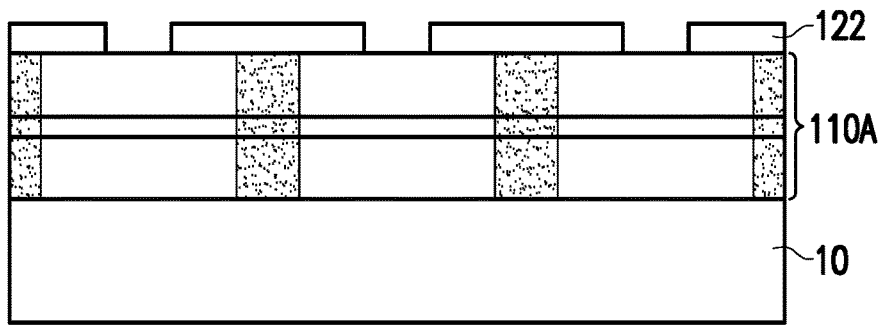
Figure 7C:
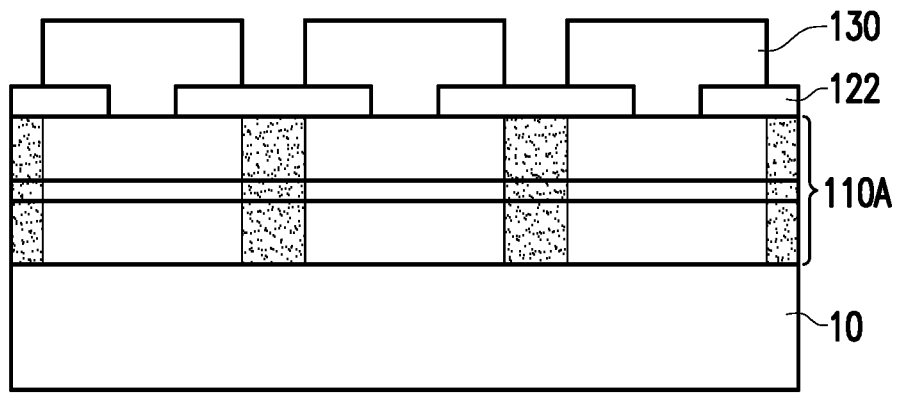
Figure 7D:
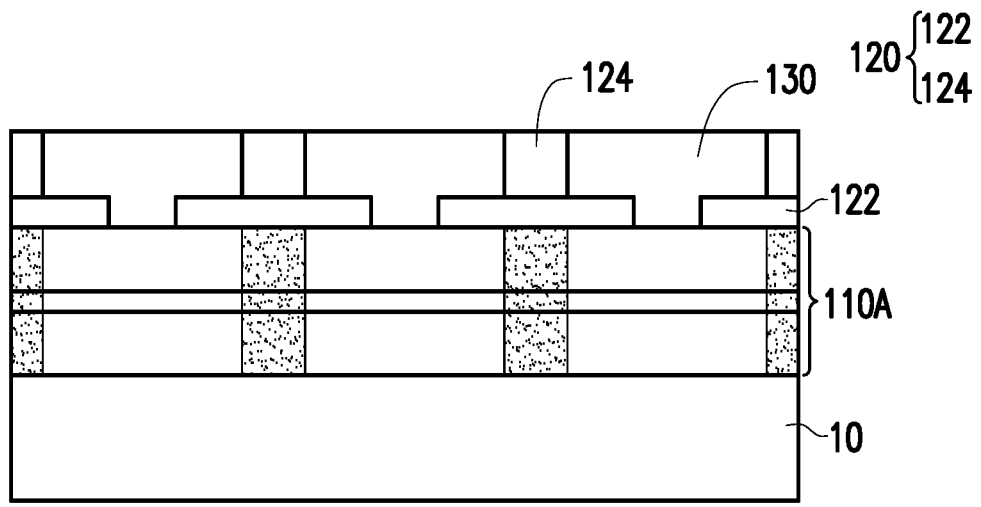
Figure 7E:
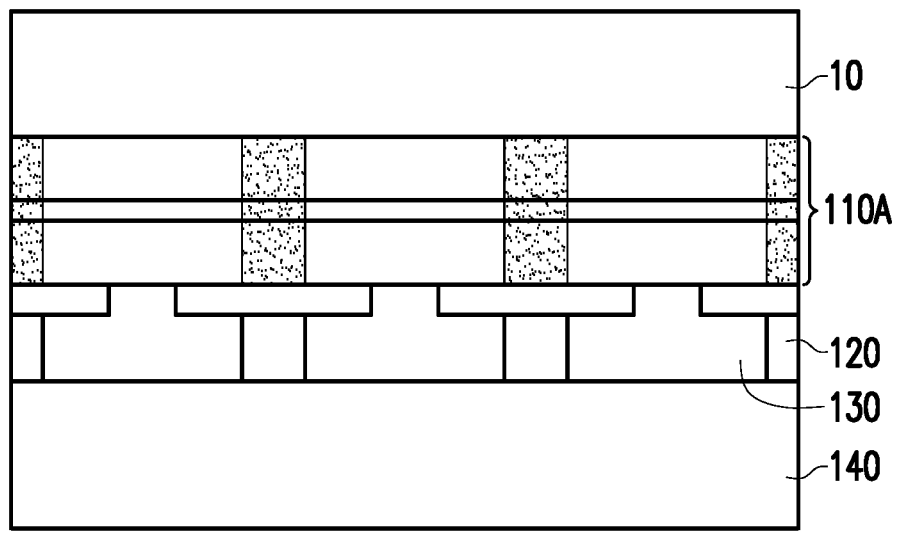
Figure 7F:
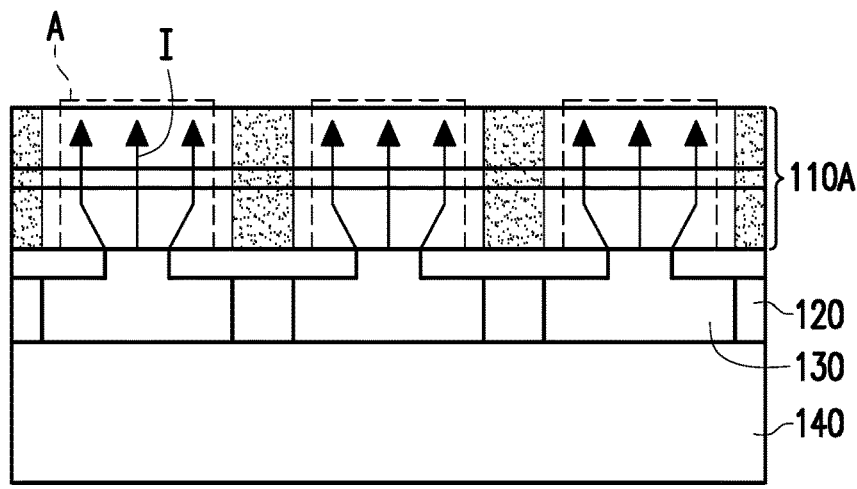

FIG. 6 is a schematic cross-sectional view illustrating a display array according to another embodiment of the disclosure. Referring to FIG. 6, a display array 100D of this embodiment is similar to the display array 100 of FIG. 1G. However, the display arrays 100D and 100 differ in that an insulating layer 120A of the display array 100D of this embodiment is only formed by a packaging insulating gel or an under-fill layer with insulating property or a dielectric film. Specifically, in this embodiment, electrode pads 130A having a smaller contact area with the semiconductor stacked layer 110 may be adopted, so as to electrically isolate the created light emitting regions A from each other.

FIG. 7A to FIG. 7F are schematic cross-sectional views illustrating a method for manufacturing a display array according to another embodiment of the disclosure. Referring to FIG. 1B and FIG. 7A to FIG. 7F, in this embodiment, after the semiconductor stacked layer 110 is formed on the substrate 10, at least one electrically insulating part B may be formed in the semiconductor stacked layer 110 by performing an ion implantation process, so as to electrically isolate the light emitting regions A and form a semiconductor stacked layer 110A. In other words, in this step, the insulating property between the adjacent light emitting regions A can be achieved through the ion implantation process, so that an additional patterning process that patterns the semiconductor stacked layer 110 will not be necessary to performed. The electrically insulating part B is mesh-like, and the impedance of the electrically insulating part B is greater than 100 times of the impedance of the light emitting region A. In this embodiment, the electrically insulating part B is distributed with a depth that reaches two opposite sides of the semiconductor stacked layer 110A, i.e., the thickness of the semiconductor stacked layer 110A. However, in some embodiments, the electrically insulating part B may be distributed with a depth less than the thickness of the semiconductor stacked layer 110A, such as being distributed in the second semiconductor material layer 116 or distributed in the second semiconductor material layer 116 and the light emitting material layer 114 without being distributed through a thickness of the entire semiconductor stacked layer 110A. The disclosure does not intend to impose a limitation in this regard.

In this way, when a voltage is applied to the light emitting regions A, it is further ensured that the adjacent light emitting regions A are electrically isolated from each other. Hence, the effect of electrical insulation between the adjacent light emitting regions A can be reinforced, and the light emitting efficiency can be further facilitated. The manufacturing process shown in FIG. 7B to FIG. 7F includes sequentially forming the first insulating layer 122, the plurality of electrode pads 130, and the second insulating layer 124, and transferring the semiconductor stacked layer 110A, the insulating layer 120, and the electrode pads 130 from the substrate 10 to the driving backplane 140. The details relating to the manufacturing process shown in FIG. 7B to FIG. 7F may be referred to the descriptions about FIG. 1C to FIG. 1G, and the manufacture can be carried out accordingly. Therefore, details in this regard will not be repeated in the following.

Figure 8:
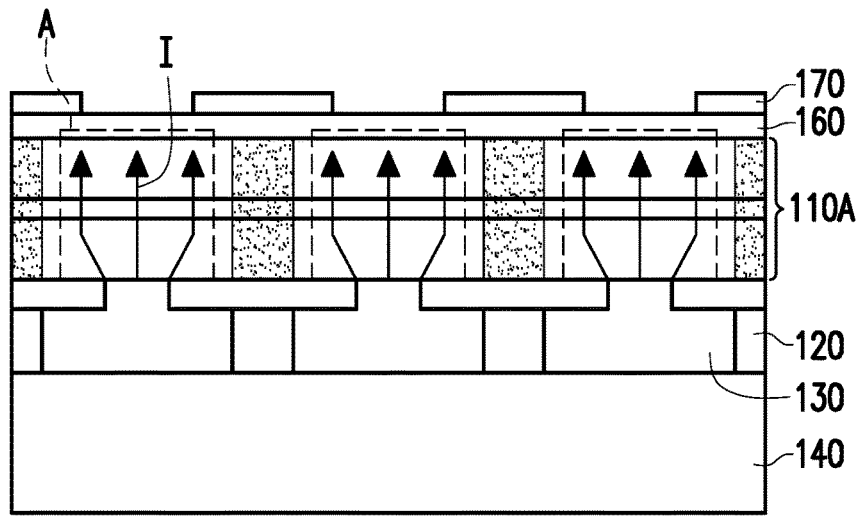
FIG. 8 is a schematic cross-sectional view illustrating a display array according to another embodiment of the disclosure.

FIG. 8 is a schematic cross-sectional view illustrating a display array according to another embodiment of the disclosure. Referring to FIG. 8, a display array 100F of this embodiment is similar to the display array 100E of FIG. 7F. However, the display arrays 100E and 100F differ in that the display array 100F of this embodiment further includes the electrode layer 160 and the light absorbing layer 170 similar to those shown in FIG. 4. Therefore, with the voltage applied between the electrode pads 130 and the electrode layer 160, the light emitting regions A of the semiconductor stacked layer 110A may be emit light, and the contrast can be increased as the emitted light is transmitted through the openings of the light absorbing layer 170. The details relating to the manufacturing process may be referred to the descriptions about FIG. 4, and the manufacture can be carried out accordingly. Therefore, details in this regard will not be repeated in the following.

Figure 9:
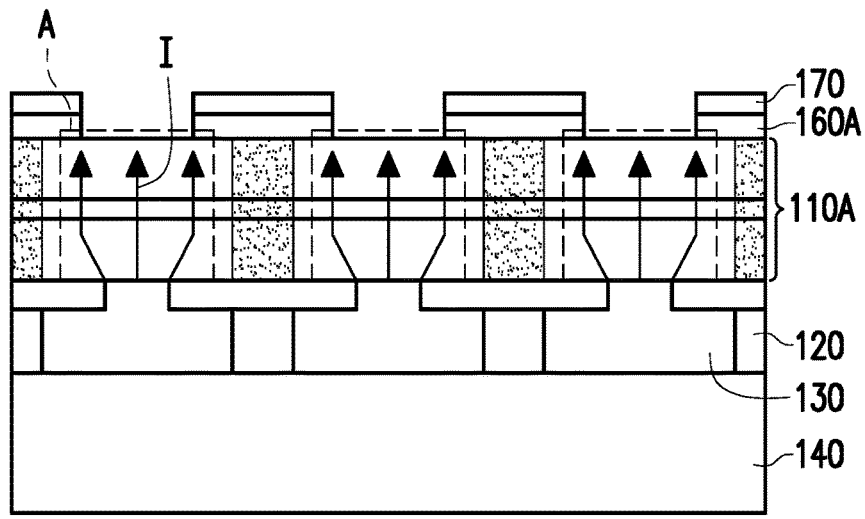
FIG. 9 is a schematic cross-sectional view illustrating a display array according to another embodiment of the disclosure.

FIG. 9 is a schematic cross-sectional view illustrating a display array according to another embodiment of the disclosure. Referring to FIG. 9, a display array 100G of this embodiment is similar to the display array 100F of FIG. 8. However, the display arrays 100G and 100F differ in that the display array 100G of this embodiment includes the electrode layer 160A similar to the electrode layer 160A shown in FIG. 5, and the electrode layer 160A includes a plurality of openings. In addition, the openings of the electrode layer 160A are located between the openings of the light absorbing layer 170 and the light emitting regions A. The details relating to the manufacturing process may be referred to the descriptions about FIG. 5, and the manufacture can be carried out accordingly. Therefore, details in this regard will not be repeated in the following.

Figure 10:
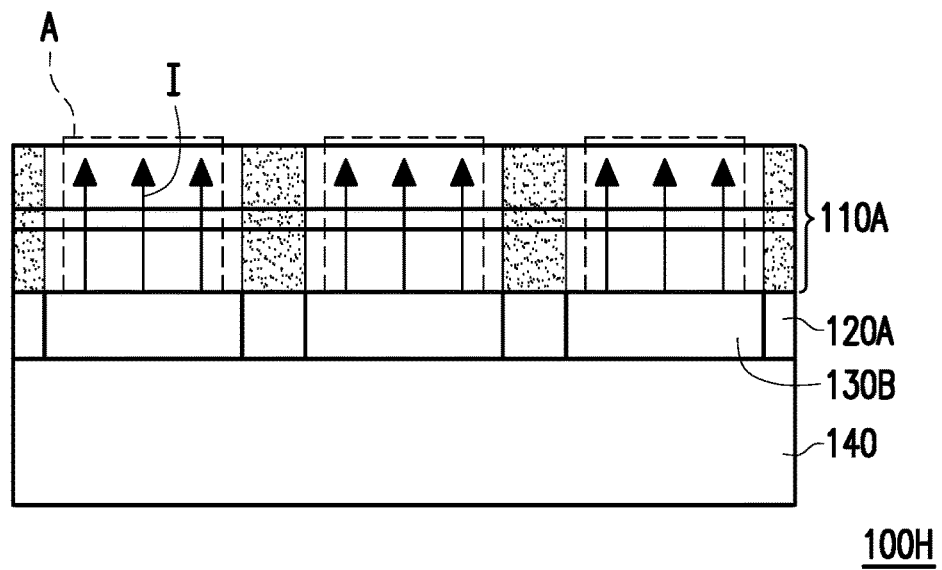
FIG. 10 is a schematic cross-sectional view illustrating a display array according to another embodiment of the disclosure.

FIG. 10 is a schematic cross-sectional view illustrating a display array according to another embodiment of the disclosure. Referring to FIG. 10, a display array 100H of this embodiment is similar to the display array 100E of FIG. 7F. However, the display arrays 100H and 100E differ in that the display array 100H of this embodiment includes the insulating layer 120A similar to the insulating layer 120A shown in FIG. 6, and the insulating layer 120A is only formed by a packaging insulating gel or an under-fill layer with insulating property or a dielectric film. However, in this embodiment, since the semiconductor stacked layer 110A has the electrically insulating part B, it is not necessary to arrange the electrode pads 130B to have a smaller contact area with the semiconductor stacked layer 110A, while the adjacent light emitting regions A are still properly electrically isolated from each other. The details relating to the manufacturing process may be referred to the descriptions about FIG. 6, and the manufacture can be carried out accordingly. Therefore, details in this regard will not be repeated in the following.

Figure 11A:
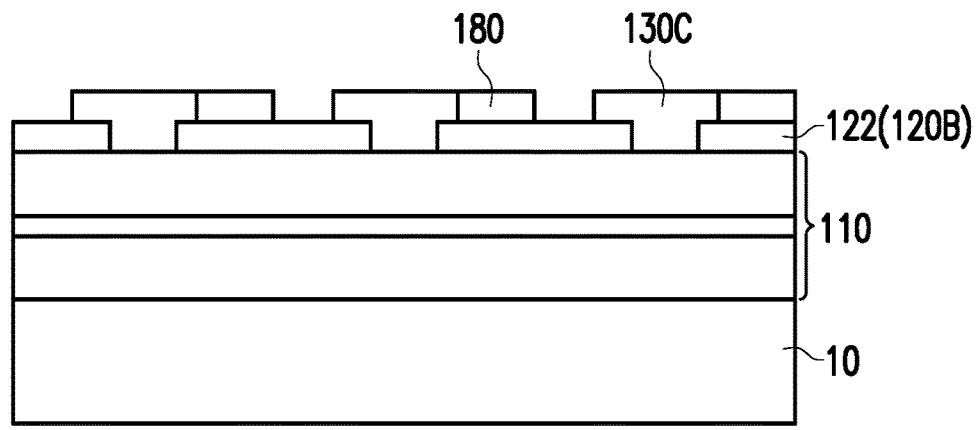
FIG. 11A to FIG. 11C are schematic cross-sectional views illustrating a method for manufacturing a display array according to another embodiment of the disclosure.
Figure 11B:
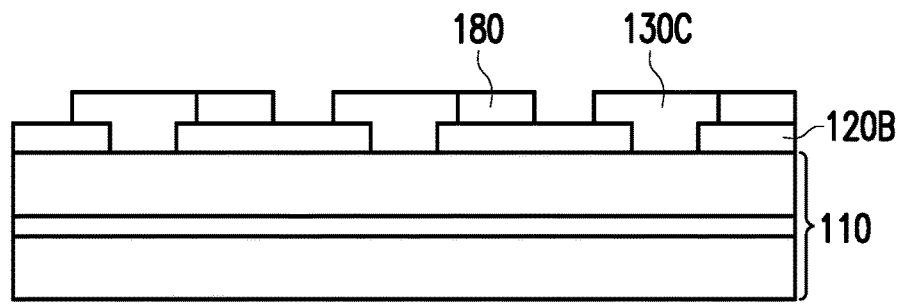
Figure 11C:
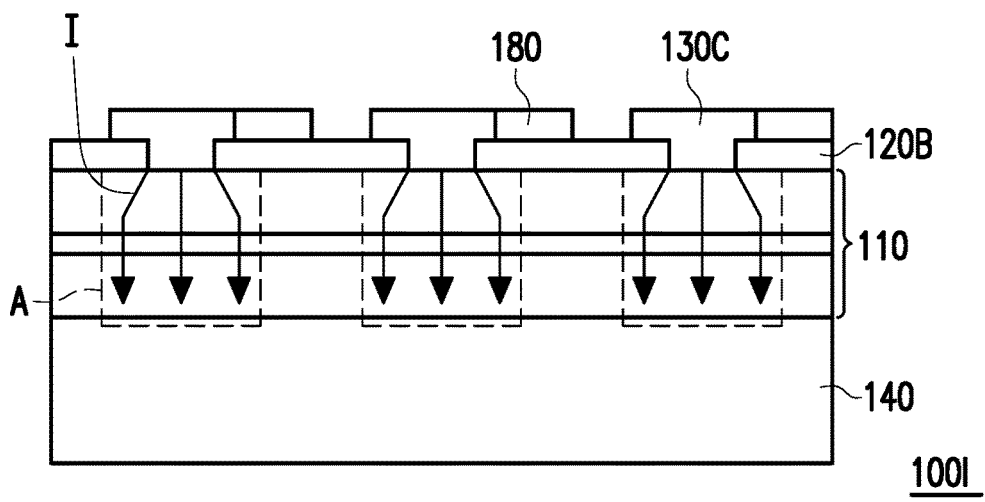

FIG. 11A to FIG. 11C are schematic cross-sectional views illustrating a method for manufacturing a display array according to another embodiment of the disclosure. Referring to FIG. 1C and FIG. 11A, in this embodiment, after the first insulating layer 122 (i.e., an insulating layer 120B) is formed on the semiconductor stacked layer 110, electrode pads 130C and active devices 180 are disposed on the first insulating layer 122. In this embodiment, the electrode pad 130C is an ITO film, for example, and the active device 180 is a thin film transistor (TFT), for example. The active device 180 is electrically connected with the electrode pad 130C. Therefore, the semiconductor stacked layer 110 may be turned on by the active device 180, and the emitted light may be transmitted through the electrode pad 130C.

Referring to FIG. 11B and FIG. 11C, after the above processes are completed, the semiconductor stacked layer 110, the insulating layer 120B, the electrode pads 130C, and the active devices 180 are transferred from the substrate 10 to the driving backplane 140, so as to form a display array 100I. In this embodiment, the processes of firstly removing and then bonding process ("removing-then-bonding process") or the processes of transferring the components to a temporary substrate and then performing removing and bonding ("transferring-then-removing and bonding process") as described above are adopted. In this way, the semiconductor stacked layer 110 is located between the electrode pads 130C and the driving backplane 140. Specifically, after the above processes are completed, the substrate 10 is removed, as shown in FIG. 11B. Then, a side of the semiconductor stacked layer 110 originally disposed to the substrate 10 is disposed to the driving backplane 140, so that the semiconductor stacked layer 110 is electrically connected to the driving backplane 140. Therefore, current conduction of the semiconductor stacked layer 110 may be turned on or off by the active device 180, and when the active device 180 is driven, the semiconductor stacked layer 110 may emit light when a voltage applied between the electrode pad 130C and the driving backplane 140, and the emitted light may be transmitted through the transmissive electrode pad 130C. In this way, the manufacturing process can be simplified, and the manufacturing difficulty can be alleviated. In addition, the issue of the conventional process that an edge is created in the die after an etching process, which results in edge light emitting efficiency deterioration, is avoided.

Figure 12:
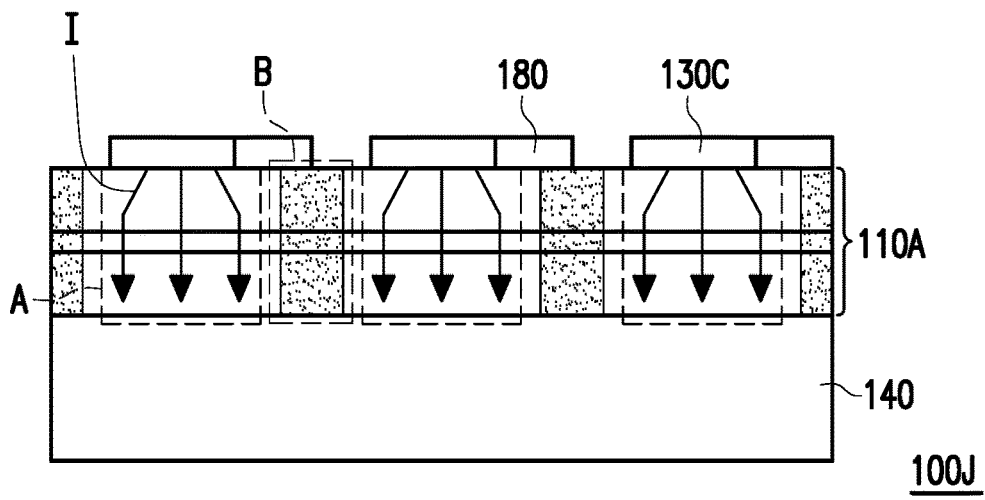
FIG. 12 is a schematic cross-sectional view illustrating a display array according to another embodiment of the disclosure.

FIG. 12 is a schematic cross-sectional view illustrating a display array according to another embodiment of the disclosure. Referring to FIG. 12, a display array 100J of this embodiment is similar to the display array 100I of FIG. 11C. However, the display arrays 100J and 100I differ in that the display array 100J of this embodiment includes the semiconductor stacked layer 110A similar to the semiconductor stacked layer 110A shown in FIG. 7F, and has at least one electrically insulating part B to separate the light emitting regions A. In addition, compared with the display array 100I of FIG. 11C, since the semiconductor stacked layer 110A has the electrically insulating part B, the insulating layer 120B disposed in the display array 100I may be omitted. However, the disclosure is not limited thereto.

Figure 13A:
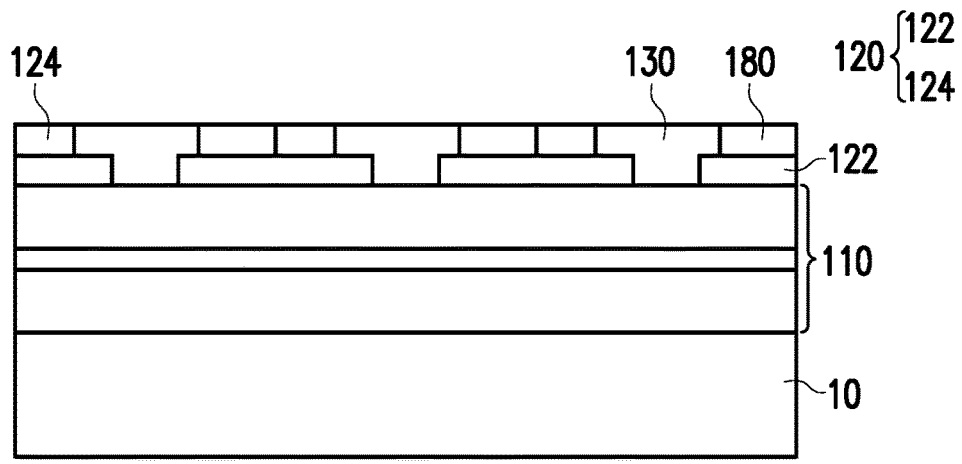
FIG. 13A to FIG. 13D are schematic cross-sectional views illustrating a method for manufacturing a display array according to another embodiment of the disclosure.
Figure 13B:
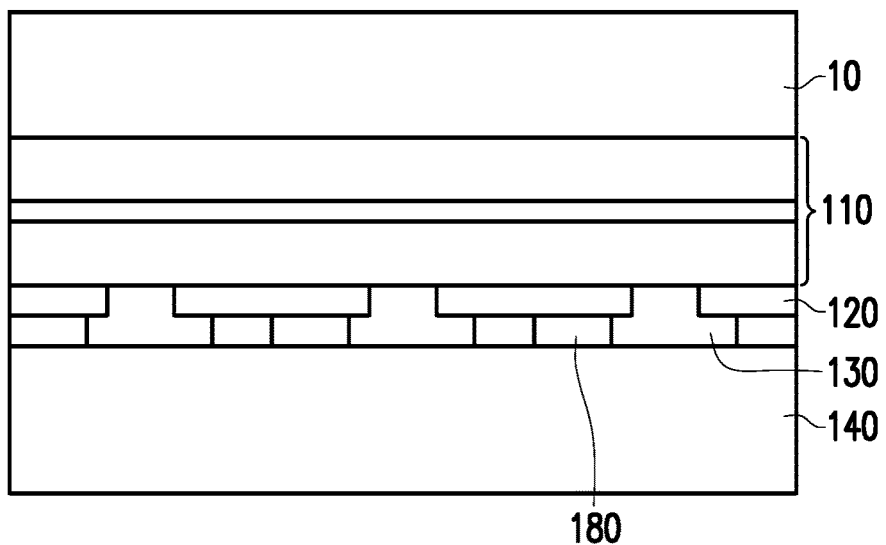
Figure 13C:
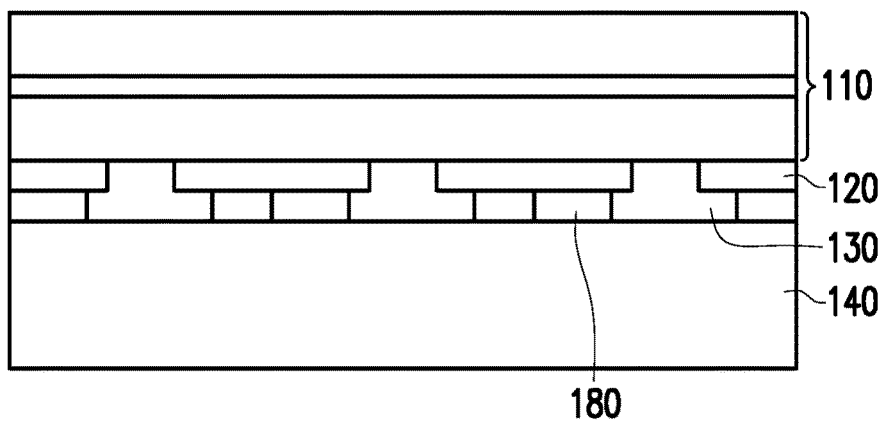

FIG. 13A to FIG. 13D are schematic cross-sectional views illustrating a method for manufacturing a display array according to another embodiment of the disclosure. Referring to FIG. 11C and FIG. 13A to FIG. 13C, in this embodiment, the structure of FIG. 13A is similar to the structure of FIG. 11A, except for the differences that the electrode pads 130 of this embodiment are formed by a non-transmissive conductive material, and after the first insulating layer 122, the electrode pads 130, the second insulating layer 124 and the active devices 180 are formed, the semiconductor stacked layer 110, the insulating layer 120, the electrode pads 130, and the active devices 180 are transferred from the substrate 10 to the driving backplane 140, as shown in FIG. 13C. The details relating to the manufacturing process may be referred to the descriptions about FIG. 1E to FIG. 1G, and the manufacture can be carried out accordingly. Therefore, details in this regard will not be repeated in the following.

Figure 13D:
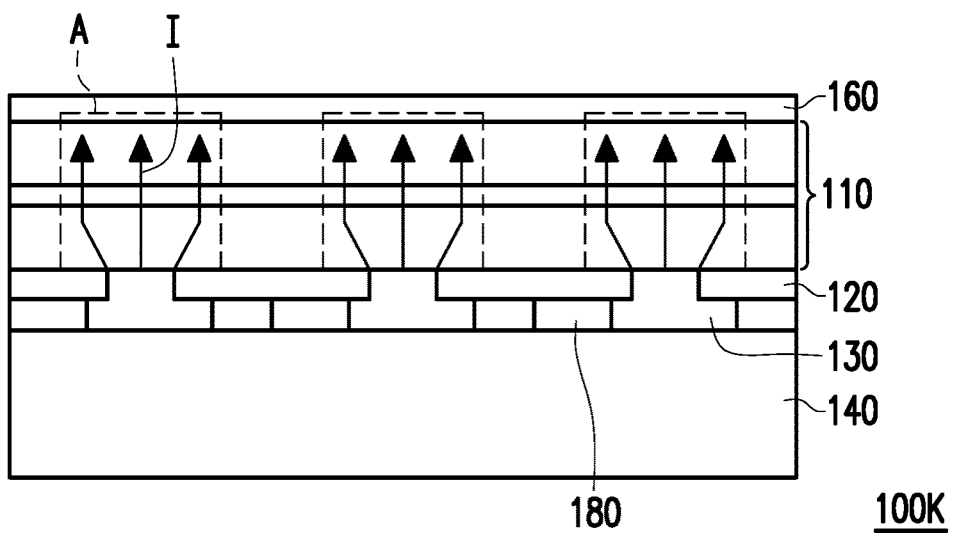

Referring to FIG. 13D, after the above processes are completed, the electrode layer 160 and the semiconductor stacked layer 110 are formed, so that the semiconductor stacked layer 110 is located between the electrode layer 160 and the active devices 180 to complete a display array 100K. In this embodiment, the electrode layer 160 includes a transparent conductive material, such as an indium tin oxide (ITO) film. Therefore, with a voltage applied between the electrode pads 130 and the electrode layer 160, the semiconductor stacked layer 110 may emit light, and the emitted light is transmitted through the transmissive electrode layer 160. The details relating to the manufacturing process may be referred to the descriptions about FIG. 4, and the manufacture can be carried out accordingly. Therefore, details in this regard will not be repeated in the following.

Figure 14:
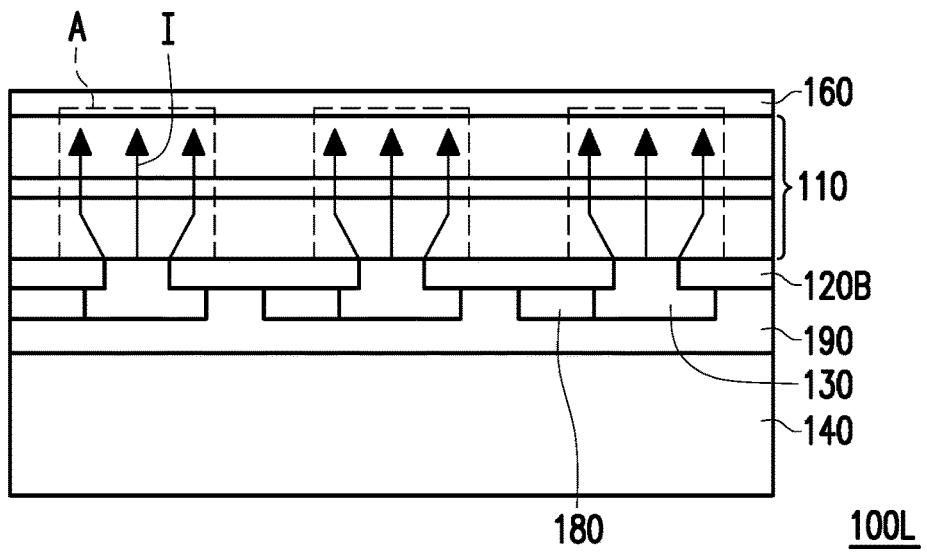
FIG. 14 is a schematic cross-sectional view illustrating a display array according to another embodiment of the disclosure.

FIG. 14 is a schematic cross-sectional view illustrating a display array according to another embodiment of the disclosure. Referring to FIG. 14, a display array 100L of this embodiment is similar to the display array 100K of FIG. 13D. However, the display array 100L and the display array 100K differ in that the display array 100L of the embodiment further includes an adhesive layer 190. The adhesive layer 190 is located between the electrode pads 130 and the driving backplane 140, and is, for example, an insulating adhesive layer or an anisotropic conductive paste. Specifically, in the process of FIG. 13A, the semiconductor stacked layer 110, the insulating layer 120B, and the electrode pads 130 may be disposed to the adhesive layer 190 after the substrate 10 is removed. Then, the adhesive layer 190 is disposed on the driving backplane 140, so that the adhesive layer 190 is located between the electrode pads 130 and the driving backplane 140 to complete the display array 100L.

Figure 15:
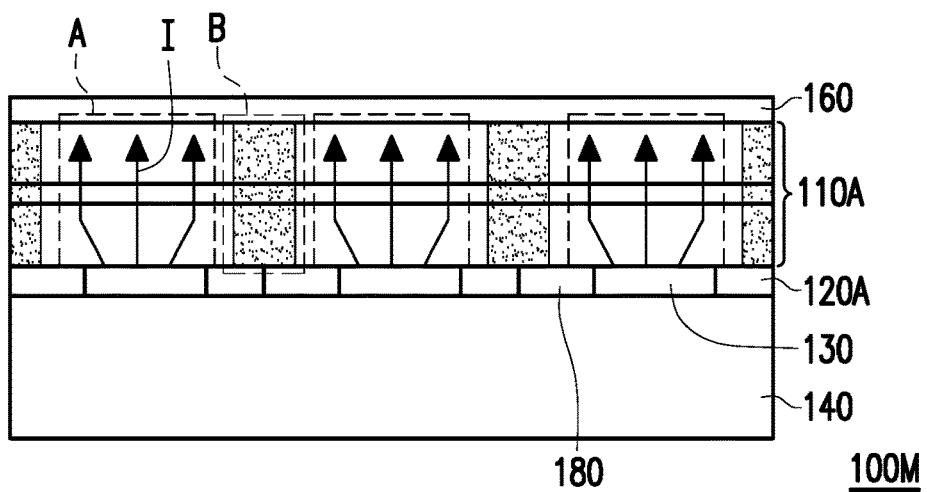
FIG. 15 is a schematic cross-sectional view illustrating a display array according to another embodiment of the disclosure.

FIG. 15 is a schematic cross-sectional view illustrating a display array according to another embodiment of the disclosure. Referring to FIG. 15, a display array 100M of this embodiment is similar to the display array 100K of FIG. 13D. However, the display arrays 100M and 100K differ in that the display array 100M of this embodiment includes the semiconductor stacked layer 110A similar to the semiconductor stacked layer 110A shown in FIG. 7F, and has at least one electrically insulating part B to separate the light emitting regions A. In addition, since the semiconductor stacked layer 100A has the electrically insulating part B, the insulating layer 120 disposed in the display array 100K shown in FIG. 13D may be omitted, and the insulating layer 120A formed by a packaging insulating gel or an under-fill layer with insulating property or a dielectric film may be adopted. However, the disclosure is not limited thereto.

Figure 16:
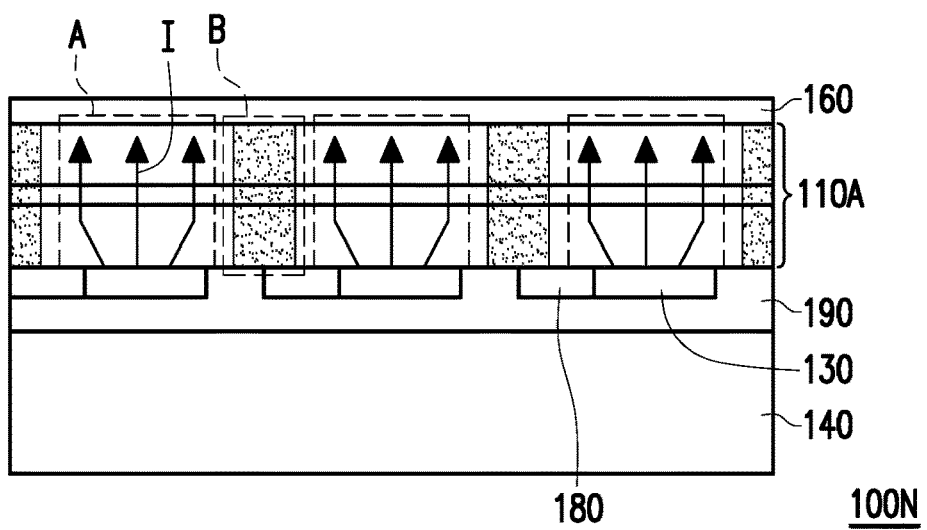
FIG. 16 is a schematic cross-sectional view illustrating a display array according to another embodiment of the disclosure.

FIG. 16 is a schematic cross-sectional view illustrating a display array according to another embodiment of the disclosure. Referring to FIG. 16, a display array 100N of this embodiment is similar to the display array 100M of FIG. 15. However, the display array 100N and the display array 100M differ in that the display array 100N of the embodiment further includes the adhesive layer 190. The adhesive layer 190 is located between the electrode pads 130 and the driving backplane 140, and is, for example, an insulating adhesive layer or an anisotropic conductive paste. The details relating to the manufacturing process may be referred to the descriptions about FIG. 14, and the manufacture can be carried out accordingly. Therefore, details in this regard will not be repeated in the following.

Figure 17:
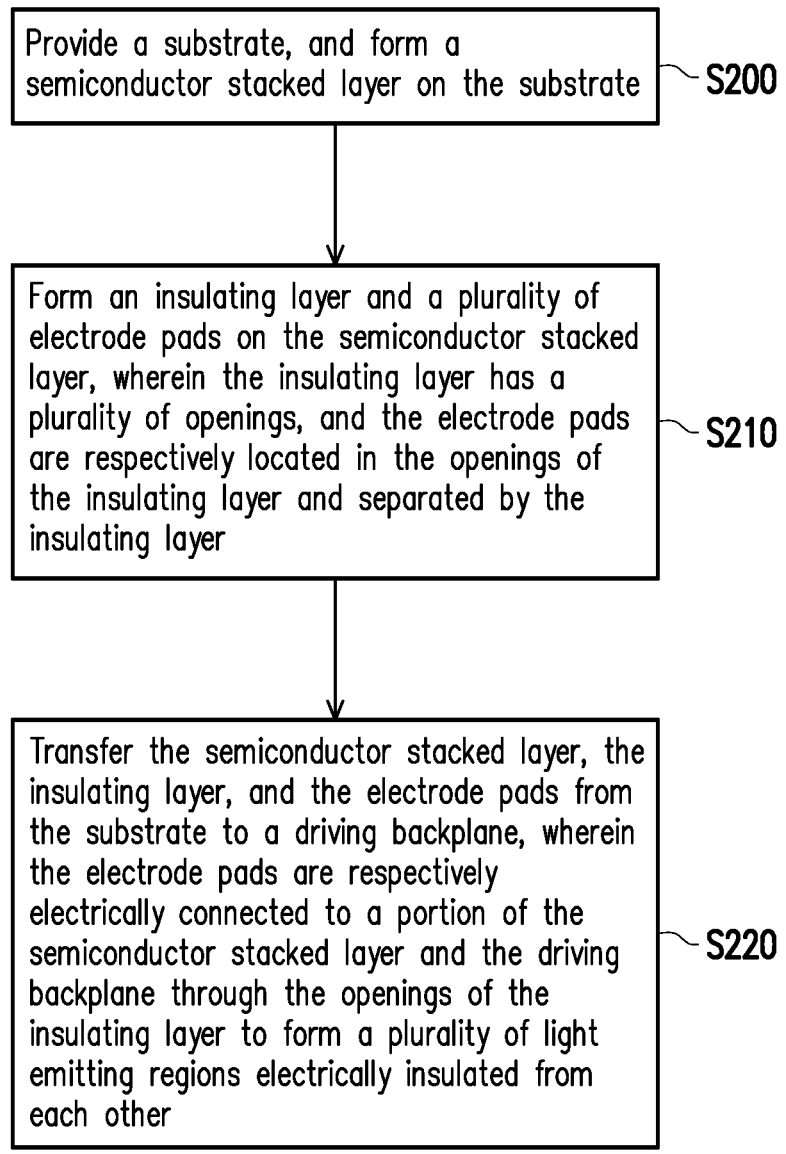
FIG. 17 is a flowchart illustrating a method for manufacturing a display array according to an embodiment of the disclosure.

FIG. 17 is a flowchart illustrating a method for manufacturing a display array according to an embodiment of the disclosure. Referring to FIG. 1A to FIG. 1G and FIG. 17, the method for manufacturing the display array of this embodiment is at least applicable to all the above embodiments. For the ease of description, the following descriptions are made based on the embodiment of FIG. 1A to FIG. 1G. However, the disclosure is not limited thereto. In the method for manufacturing the display array of the embodiment, Step S200 is firstly performed, where the substrate 10 is provided, and the semiconductor stacked layer 110 is formed on the substrate 10, as shown in FIG. 1B. Then, Step S210 is performed, where the insulating layer 120 and the electrode pads 130 are formed on the semiconductor stacked layer 110. The insulating layer 120 has the openings O1, and the electrode pads 130 are respectively located in the openings O1 of the insulating layer 120 and are separated by the insulating layer 120, as shown in FIG. 1E. Then, Step S220 is performed, where the semiconductor stacked layer 110, the insulating layer 120, and the electrode pads 130 are transferred from the substrate 10 to the driving backplane 140. The electrode pads 130 are respectively electrically connected to a portion of the semiconductor stacked layer 110 and the driving backplane 140 through the openings O1 of the insulating layer 120, so as to form the light emitting regions A electrically isolated from each other in the semiconductor stacked layer 110, as shown in FIG. 1G. In this way, compared with the conventional process, the manufacturing process can be simplified, and the manufacturing difficulty can be alleviated. In addition, the issue of the conventional process that an edge is created in the die after an etching process, which results in edge light emitting efficiency deterioration can be solved.

In view of the foregoing, in the method for manufacturing the display array according to the embodiments of the disclosure, the semiconductor stacked layer, the insulating layer, and the electrode pads are formed on the substrate, and the insulating layer has the openings, so that the electrode pads are located in the openings of the insulating layer and are separated by the insulating layer. In this way, the electrode pads are respectively electrically connected to a portion of the semiconductor stacked layer through the openings of the insulating layer, so as to form the light emitting regions electrically isolated from each other in the semiconductor stacked layer. Therefore, compared with the conventional process, the manufacturing process can be simplified, and the manufacturing difficulty can be alleviated. In addition, the issue in the conventional process that an edge is created in the die after an etching process, which results in edge light emitting efficiency deterioration, is avoided.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method for manufacturing a display array, comprising:
providing a substrate and forming a semiconductor stacked layer on the substrate;
forming an insulating layer and a plurality of electrode pads on an outer surface of the semiconductor stacked layer, the insulating layer and the electrode pads directly contacting the semiconductor stacked layer, wherein the insulating layer has a plurality of openings spaced apart from each other;
transferring the semiconductor stacked layer, the insulating layer and the electrode pads from the substrate to a driving backplane, wherein the electrode pads are respectively electrically connected to the driving backplane through the openings of the insulating layer to form a plurality of light emitting regions in the semiconductor stacked layer as the electrode pads and the semiconductor stacked layer are energized by the driving backplane, and the light emitting regions in the semiconductor stacked layer are not patterned;
forming an electrode layer on the semiconductor stacked layer; and
forming a light absorbing layer on the electrode layer, the electrode layer being located between the light absorbing layer and the semiconductor stacked layer, wherein the light absorbing layer has a plurality of openings, the light emitting regions are located between the openings of the light absorbing layer and the electrode pads.

2. The method for manufacturing the display array as claimed in claim 1, wherein the electrode pads directly contact the insulating layer.

3. The method for manufacturing the display array as claimed in claim 1, wherein the electrode layer has a plurality of openings, and the openings of the electrode layer are located between the openings of the light absorbing layer and the light emitting regions.

4. The method for manufacturing the display array as claimed in claim 1, wherein a light emitting area of the light emitting regions in the semiconductor stacked layer is greater than or equal to an area occupied by the openings of the light absorbing layer.

5. The method for manufacturing the display array as claimed in claim 1, wherein an area occupied by the openings of the light absorbing layer is greater than an area occupied by the openings of the insulating layer.

6. The method for manufacturing the display array as claimed in claim 1, wherein a covering area of the light absorbing layer on the semiconductor stacked layer is smaller than a covering area of the insulating layer on the semiconductor stacked layer.

7. The method for manufacturing the display array as claimed in claim 1, wherein transferring the semiconductor stacked layer, the insulating layer, and the electrode pads from the substrate to the driving backplane comprises:
    disposing the semiconductor stacked layer on the driving backplane; and
    removing the substrate, wherein the insulating layer is located between the semiconductor stacked layer and the driving backplane.

8. The method for manufacturing the display array as claimed in claim 1,
    wherein an arrangement pitch of two adjacent light emitting regions of the light emitting regions is less than or equal to 20 micrometers.

9. A method for manufacturing a display array, comprising:
    providing a substrate and forming a semiconductor stacked layer on the substrate;
    forming an insulating layer and a plurality of electrode pads on an outer surface of the semiconductor stacked layer, the insulating layer and the electrode pads directly contacting the semiconductor stacked layer, wherein the insulating layer has a plurality of openings spaced apart from each other; and
    transferring the semiconductor stacked layer, the insulating layer and the electrode pads from the substrate to a driving backplane, wherein the electrode pads are respectively electrically connected to the driving backplane through the openings of the insulating layer to form a plurality of light emitting regions in the semiconductor stacked layer as the electrode pads and the semiconductor stacked layer are energized by the driving backplane, and the light emitting regions in the semiconductor stacked layer are not patterned,
    wherein the insulating layer comprises a first insulating layer and a second insulating layer, and forming the insulating layer and the electrode pads on the semiconductor stacked layer further comprises:
    forming the first insulating layer on the semiconductor stacked layer, wherein the first insulating layer has a plurality of openings;
    disposing the electrode pads in the openings of the first insulating layer; and
    filling the second insulating layer between the electrode pads, wherein the first insulating layer is located between the second insulating layer and the semiconductor stacked layer.

* * * * *